US012588318B2

(12) United States Patent
Sung et al.

(10) Patent No.: US 12,588,318 B2
(45) Date of Patent: Mar. 24, 2026

(54) ELECTRONIC DEVICE

(71) Applicant: InnoLux Corporation, Miao-Li County (TW)

(72) Inventors: Chao-Chin Sung, Miao-Li County (TW); Chueh-Yuan Nien, Miao-Li County (TW); Chien-Tzu Chu, Miao-Li County (TW); Chao-Sen Yang, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 376 days.

(21) Appl. No.: 18/327,262

(22) Filed: Jun. 1, 2023

(65) Prior Publication Data

US 2024/0006553 A1 Jan. 4, 2024

(30) Foreign Application Priority Data

Jul. 4, 2022 (CN) .......................... 202210785459.1

(51) Int. Cl.
*H10H 20/814* (2025.01)
*H01L 25/16* (2023.01)
*H10H 20/856* (2025.01)
*H10H 20/857* (2025.01)

(52) U.S. Cl.
CPC ........ *H10H 20/814* (2025.01); *H10H 20/857* (2025.01)

(58) Field of Classification Search
CPC ... H01L 25/167; H10H 20/814; H10H 20/856
See application file for complete search history.

(56) References Cited

U.S. PATENT DOCUMENTS

| | | | |
|---|---|---|---|
| 2020/0075823 A1* | 3/2020 | Yang | H10D 86/40 |
| 2021/0143134 A1 | 5/2021 | Wang | |
| 2022/0181521 A1* | 6/2022 | Chu | H10H 20/857 |
| 2023/0223424 A1* | 7/2023 | Chae | H10H 29/142 |
| | | | 257/88 |
| 2023/0238370 A1* | 7/2023 | Shin | H10H 20/857 |
| | | | 257/91 |

FOREIGN PATENT DOCUMENTS

CN 112467017 A 3/2021

OTHER PUBLICATIONS

TW Office Action dated Jun. 2, 2025 in Taiwan application No. 112109530.

* cited by examiner

*Primary Examiner* — Antonio B Crite
(74) *Attorney, Agent, or Firm* — McClure, Qualey & Rodack, LLP

(57) ABSTRACT

An electronic device is provided. The electronic device includes a driving substrate, a light-emitting unit, and a reflective structure. The driving substrate includes a contact. The light-emitting unit is disposed on the driving substrate and electrically connected to the contact. The reflective structure is disposed on the driving substrate. Wherein the reflective structure includes a first insulating layer, a metal layer, and a second insulating layer, and the metal layer is disposed between the first insulating layer and the second insulating layer.

19 Claims, 5 Drawing Sheets

ELECTRONIC DEVICE

CROSS REFERENCE TO RELATED APPLICATIONS

This application claims priority of China Patent Application No. CN 202210785459.1, filed on Jul. 4, 2022, the entirety of which is incorporated by reference herein.

TECHNICAL FIELD

Some embodiments of the present disclosure relate to an electronic device, and, in particular, to an electronic device including a reflective structure.

BACKGROUND

In general, a reflective component such as an optical reflective sheet or an optical reflective adhesive can be provided in the light-emitting unit of an electronic device, thereby reducing light loss from the light-emitting unit and/or improving the brightness of the electronic device.

However, the application of the optical reflective sheet is limited by the cut size because the precision of the cutting process for cutting the optical reflective sheet is limited. On the other hand, the optical reflective adhesive is limited by its own thickness. For example, when the thickness of the optical reflective adhesive is insufficient, sufficient reflectivity cannot be provided. When the thickness of the optical reflective adhesive is excess, the optical reflective adhesive may cover and/or overflow to the light-emitting surface of the light-emitting unit, thereby causing problems such as dark regions or uneven lighting.

Therefore, existing electronic devices have gradually met their intended uses, they still do not fully meet the requirements in all aspects. Therefore, there are still some problems to be overcome with respect to the electronic device.

SUMMARY

In some embodiments, an electronic device is provided. The electronic device includes a driving substrate, a light-emitting unit, and a reflective structure. The driving substrate includes a contact. The light-emitting unit is disposed on the driving substrate and electrically connected to the contact. The reflective structure is disposed on the driving substrate. Wherein the reflective structure includes a first insulating layer, a metal layer, and a second insulating layer, and the metal layer is disposed between the first insulating layer and the second insulating layer.

The electronic device of the present disclosure may be applied in various types of electronic apparatus. In order to make the features and advantages of some embodiments of the present disclosure more understand, some embodiments of the present disclosure are listed below in conjunction with the accompanying drawings, and are described in detail as follows.

BRIEF DESCRIPTION OF THE DRAWINGS

The present disclosure can be more fully understood from the following detailed description when read in conjunction with the accompanying drawings. It should be noted that, according to the standard practice in the industry, the various features are not drawn to scale. In fact, the dimensions of the various features may be arbitrarily increased or reduced for clarity.

DETAILED DESCRIPTION

Figure 1:
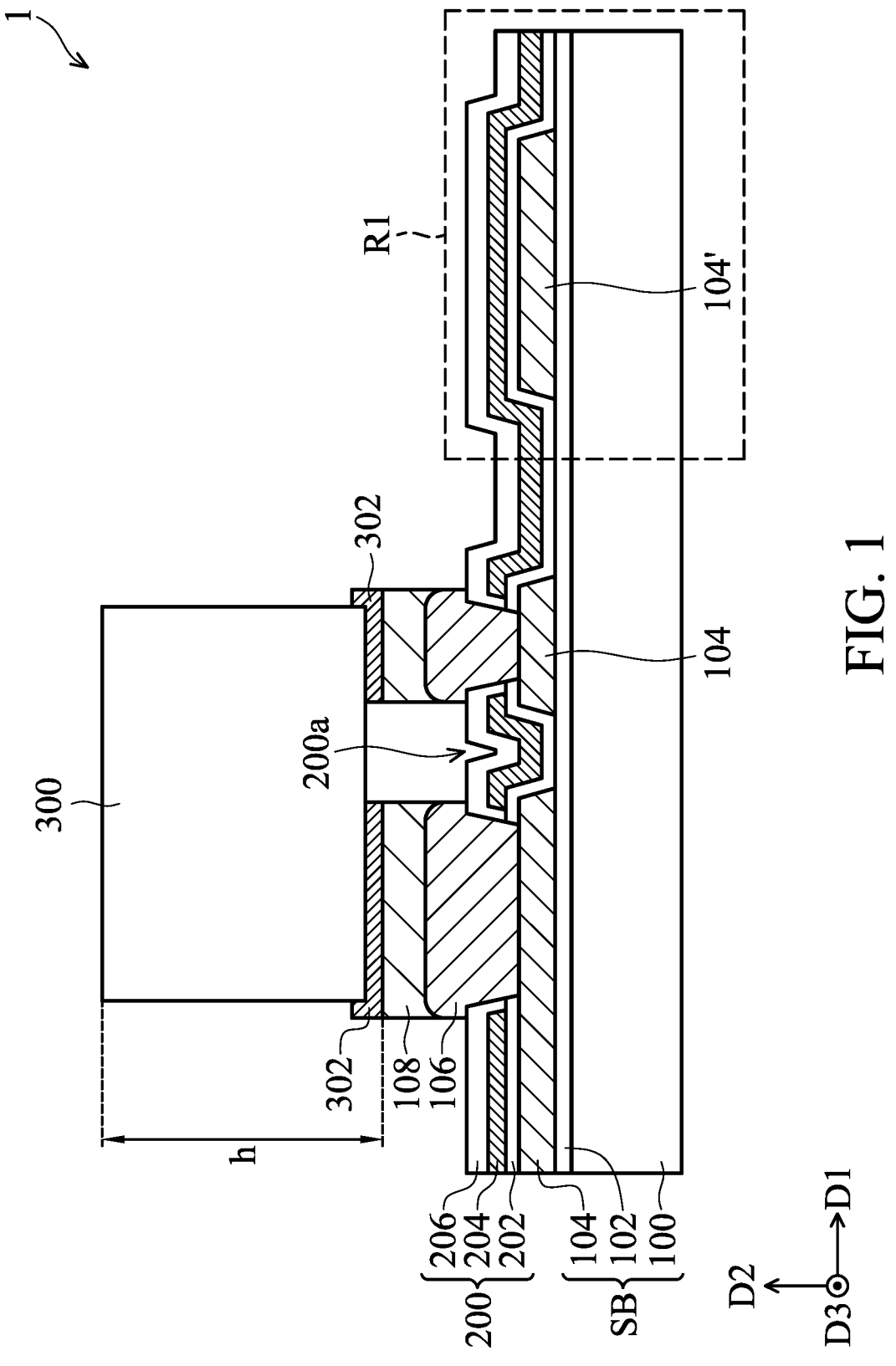
FIG. 1 is a schematic cross-sectional view showing an electronic device according to some embodiments of the present disclosure.

Electronic devices of various embodiments of the present disclosure will be described in detail below. It should be understood that the following description provides many different embodiments for implementing various aspects of some embodiments of the present disclosure. The specific elements and arrangements described below are merely to clearly describe some embodiments of the present disclosure. Of course, these are only used as examples rather than limitations of the present disclosure. Furthermore, similar and/or corresponding reference numerals may be used in different embodiments to designate similar and/or corresponding elements in order to clearly describe the present disclosure. However, the use of these similar and/or corresponding reference numerals is only for the purpose of simply and clearly description of some embodiments of the present disclosure, and does not imply any correlation between the different embodiments and/or structures discussed.

It should be understood that relative terms, such as "lower", "bottom", "higher", or "top" may be used in various embodiments to describe the relative relationship of one element of the drawings to another element. It will be understood that if the device in the drawings were turned upside down, elements described on the "lower" side would become elements on the "upper" side. The embodiments of the present disclosure can be understood together with the drawings, and the drawings of the present disclosure are also regarded as a portion of the disclosure.

Furthermore, when it is mentioned that a first material layer is located on or over a second material layer, it may include the embodiment which the first material layer and the second material layer are in direct contact and the embodiment which the first material layer and the second material layer are not in direct contact with each other, that is one or more layers of other materials is between the first material layer and the second material layer. However, if the first material layer is directly on the second material layer, it means that the first material layer and the second material layer are in direct contact.

In addition, it should be understood that ordinal numbers such as "first", "second", and the like used in the description and claims are used to modify elements and are not intended to imply and represent the element(s) have any previous ordinal numbers, and do not represent the order of a certain element and another element, or the order of the manufacturing method, and the use of these ordinal numbers is only used to clearly distinguished an element with a certain name and another element with the same name. The claims and the specification may not use the same terms, for example, a first element in the specification may be a second element in the claim.

In some embodiments of the present disclosure, terms related to bonding and connection, such as "connect", "interconnect", "bond", and the like, unless otherwise defined, may refer to two structures in direct contact, or may also refer to two structures not in direct contact, that is there is another structure disposed between the two structures. Moreover the terms related to bonding and connection can also include embodiments in which both structures are movable, or both structures are fixed. Furthermore, the terms "electrically connected" or "electrically coupled" include any direct and indirect means of electrical connection.

Herein, the terms "about", "approximately", and "substantially" generally mean within 10%, within 5%, within 3%, within 2%, within 1%, or within 0.5% of a given value or range. The given value is an approximate value, that is, "about", "approximately", and "substantially" can still be implied without the specific description of "about", "approximately", and "substantially". The phrase "a range between a first value and a second value" means that the range includes the first value, the second value, and other values in between. Furthermore, any two values or directions used for comparison may have certain tolerance. If the first value is equal to the second value, it implies that there may be a tolerance within about 10%, within 5%, within 3%, within 2%, within 1%, or within 1% between the first value and the second value. If the first direction is perpendicular to the second direction, the angle between the first direction and the second direction may be between 80 degrees and 100 degrees. If the first direction is parallel to the second direction, the angle between the first direction and the second direction may be between 0 degrees and 10 degrees.

Certain terms may be used throughout the specification and claims in the present disclosure to refer to specific elements. A person of ordinary skills in the art should be understood that electronic device manufacturers may refer to the same element by different terms. The present disclosure does not intend to distinguish between elements that have the same function but with different terms. In the following description and claims, terms such as "including", "comprising", and "having" are open-ended words, so they should be interpreted as meaning "including but not limited to . . . ". Therefore, when the terms "including", "comprising", and/or "having" is used in the description of the present disclosure, it designates the presence of corresponding features, regions, steps, operations, and/or elements, but does not exclude the presence of one or more corresponding features, regions, steps, operations, and/or elements.

It should be understood that, in the following embodiments, features in several different embodiments may be replaced, recombined, and bonded to complete other embodiments without departing from the spirit of the present disclosure. The features of the various embodiments can be used in any combination as long as they do not violate the spirit of the disclosure or conflict with each other.

Unless otherwise defined, all terms (including technical and scientific terms) used herein have the same meaning as commonly understood by a person of ordinary skills in the art. It is understood that these terms, such as those defined in commonly used dictionaries, should be interpreted as having meanings consistent with the relevant art and the background or context of the present disclosure, and should not be interpreted in an idealized or overly formal manner, unless otherwise defined in the embodiments of the present disclosure.

Herein, the respective directions are not limited to three axes of the rectangular coordinate system, such as the X-axis, the Y-axis, and the Z-axis, and may be interpreted in a broader sense. For example, the X-axis, the Y-axis, and the Z-axis may be perpendicular to each other, or may represent different directions that are not perpendicular to each other, but the present disclosure is not limited thereto. For convenience of description, hereinafter, the X-axis direction is the first direction D1 (width direction), the Z-axis direction is the second direction D2 (height or thickness direction), and the Y-axis direction is the third direction D3. In some embodiments, the schematic cross-sectional views described herein are schematic views of the XZ plane.

In some embodiments, the electronic device of the present disclosure may include a display device, a lighting device, an antenna device, a sensing device, or a titling device, but the present disclosure is not limited thereto. The electronic device may be a foldable or flexible electronic device. The display device may be a non-self-luminous display device or a self-luminous display device. The antenna device may be a liquid crystal antenna device or a non-liquid crystal antenna device. The sensing device may be a sensing device for sensing capacitance, light, heat, or ultrasonic waves, but the present disclosure is not limited thereto. The electronic elements may include passive elements and active elements, such as capacitors, resistors, inductors, diodes, transistors, and the like. The diodes may include light-emitting diodes or photodiodes. The light-emitting diodes may include, for example, organic light-emitting diodes (OLEDs), mini light-emitting diodes (mini LEDs), micro light-emitting diodes (micro LEDs), or quantum dot light-emitting diodes (quantum dot LED), but the present disclosure is not limited thereto. The titling device may be, for example, a display titling device or an antenna titling device, but the present disclosure is not limited thereto. It should be noted that, the electronic device can be any arrangement and combination of the foregoing, but the present disclosure is not limited thereto. The content of the present disclosure will be described below with an electronic device including a light-emitting unit, and the light-emitting unit includes a diode, but the present disclosure is not limited thereto.

In addition, the shape of the electronic device may be rectangular, circular, polygonal, a shape with curved edges, or another suitable shape. The electronic device may have a peripheral system, such as a processing system, a driving system, a control system, a light source system, a shelf system, or the like to support the display device or titling device.

In some embodiments, additional components may be added to the electronic device of the present disclosure. In some embodiments, some components of the electronic device disclosed herein may be replaced or omitted. In some embodiments, additional processing steps may be provided before, during, and/or after a manufacturing method of an electronic device. In some embodiments, some of the described processing steps may be replaced or omitted, and the order of some of the described processing steps may be interchangeable. Furthermore, it should be understood that some of the described processing steps may be replaced or deleted for other embodiments of the method.

In some embodiments, the manufacturing method of the electronic device disclosed herein is applicable to a chip first process and a redistribution layer first (RDL first) process. In some embodiments, the manufacturing method of the electronic device disclosed herein is applicable to a (conductive) pad up process and a pad down process. For the convenience of description, in the following, the redistribution layer first process with the pad down process is taken as an example, but the present disclosure is not limited thereto. In addition, in the present disclosure, the number and size of each element in the drawings are only for illustration, and are not used to limit the scope of the present disclosure.

Referring to FIG. 1, it is a schematic cross-sectional view showing an electronic device 1 according to some embodiments of the present disclosure. In some embodiments, the electronic device 1 may include a driving substrate SB, a reflective structure 200, and a light-emitting unit 300. In some embodiments, the reflective structure 200 may be disposed on the driving substrate SB. In some embodiments, the light-emitting unit 300 may be disposed on the driving substrate SB, and the light-emitting unit 300 may be electrically connected to the driving substrate SB. In some embodiments, the light-emitting unit 300 is adjacent to the reflective structure 200 in the first direction D1. In some embodiments, the light-emitting units 300 are arranged alternately with the reflective structures 200 in the first direction D1. In some embodiments, a plurality of light-emitting units 300 may be provided, and the reflective structure 200 may be disposed between adjacent light-emitting units 300 of the plurality of light-emitting units 300.

In some embodiments, the driving substrate SB may include a substrate (base) 100. In some embodiments, according to different requirements, the substrate 100 may be, or include, a rigid substrate, a flexible substrate, or a combination of the abovementioned substrates, but the present disclosure is not limited thereto. In some embodiments, the material of the substrate 100 may be, or include, wafer, glass, quartz, ceramics, sapphire, plastic, other suitable materials, or a combination of the abovementioned materials, but the present disclosure is not limited thereto. In some embodiments, the material of the substrate 100 may be, or include, polycarbonate (PC), polyimide (PI), polypropylene (PP), polyethylene terephthalate (PET), other suitable materials, or a combination of the abovementioned materials, but the present disclosure is not limited thereto. In some embodiments, the substrate 100 may be a single-layer structure or multi-layer structure, but the present disclosure is not limited thereto. In some embodiments, the substrate 100 may be, or include, a transparent substrate, a semi-transparent substrate, or an opaque substrate.

In some embodiments, the driving substrate SB may further include a driving circuit (not shown) disposed on the substrate 100. In some embodiments, the driving circuit may include active elements, passive elements, wires, other suitable elements, or a combination thereof, but the present disclosure is not limited thereto. In some embodiments, the driving circuit may be disposed on the central region and/or the peripheral region of the driving substrate SB. In some embodiments, the driving circuit may be a gate driving circuit or a source driving circuit. In some embodiments, the driving circuit may include a plurality of transistors (not shown). In some embodiments, the transistor may be a driving transistor in order to drive the light-emitting unit 300.

In some embodiments, the driving substrate SB may further include a passivation layer 102. In some embodiments, the passivation layer 102 is disposed on the substrate 100. In some embodiments, the material of the passivation layer 102 may be, or include, an organic material, an inorganic material, or a combination of the abovementioned materials, but the present disclosure is not limited thereto. In some embodiments, the organic material may be, or include, an oxide such as silicon oxide, a nitride such as silicon nitride, an oxynitride such as silicon oxynitride, other suitable organic materials, or a combination of the abovementioned materials, but the present disclosure is not limited thereto. In some embodiments, the passivation layer 102 may be disposed on the driving circuit to serve as an insulating layer of the driving circuit. In some embodiments, for example, the passivation layer 102 may be formed by chemical vapor deposition (CVD), sputtering, resistance heating evaporation, electron beam evaporation, other suitable deposition methods or a combination of the abovementioned method.

In some embodiments, the driving substrate SB may further include a contact 104. In some embodiments, the contact 104 is disposed on the passivation layer 102, and the contact 104 may be electrically connected with the driving circuit in the driving substrate SB. In some embodiments, the contact 104 may be regarded as a portion of the redistribution layer in the RDL first process. In some embodiments, the driving circuit in the driving substrate SB may be electrically connected to the light-emitting unit 300 disposed on the driving substrate SB by the contact 104 in order to drive the light-emitting unit 300.

In some embodiments, the material of the contact 104 may include or be a conductive material. In some embodiments, the conductive material may be, or include, metal, metal nitride, semiconductor material, any other suitable conductive material, or a combination thereof, but the present disclosure is not limited thereto. In some embodiments, the conductive material may be, or include, gold (Au), nickel (Ni), platinum (Pt), palladium (Pd), iridium (Ir), titanium (Ti), chromium (Cr), tungsten (W), aluminum (Al), copper (Cu), molybdenum (Mo), titanium (Ti), silver (Ag), magnesium (Mg), alloys or compounds thereof, other suitable conductive materials, or a combination thereof, but the present disclosure is not limited thereto. In some embodiments, the conductive material may be, or include, a transparent conductive oxide (TCO). For example, the transparent conductive oxide may include indium tin oxide (ITO), antimony zinc oxide (AZO), tin oxide (SnO), zinc oxide (ZnO), indium zinc oxide (IZO), indium gallium zinc oxide (IGZO), indium tin zinc oxide (ITZO), antimony tin oxide (ATO), other suitable transparent conductive material, or a combination thereof, but the present disclosure is not limited thereto. In some embodiments, for example, the contact 104 may be formed by chemical vapor deposition, sputtering, resistance heating evaporation, electron beam evaporation, physical vapor deposition (PVD), other suitable deposition process, or a combination thereof, but the present disclosure is not limited thereto.

In some embodiments, the driving substrate SB may further include other conductive layer, other insulating layer, or a combination thereof, but the present disclosure is not limited thereto. In some embodiments, one or more other conductive layers and/or insulating layers may be disposed on the substrate 100. In some embodiments, other insulating layer may be, or include, the same or different conductive material as the passivation layer 102. In some embodiments, the other conductive layer may be, or include, the same or different conductive material as the contact 104.

As shown in FIG. 1, in some embodiments, the reflective structure 200 may include a first insulating layer 202, a metal layer 204, and a second insulating layer 206, and the metal layer 204 may be disposed between the first insulating layer 202 and the second insulating layer 206. In some embodiments, the first insulating layer 202 may be disposed on the contact 104 of the driving substrate SB and the passivation layer 102, the metal layer 204 may be disposed on the first insulating layer 202, and the second insulating layer 206 may be disposed on the metal layer 204. In some embodiments, the reflective structure 200 may expose the top surface of the contact 104 so that the top surface of the contact 104 is electrically connected to the subsequently formed solder 106 and the solder 108. In some embodiments, the first insulating layer 202, the metal layer 204, and the second insulating layer 206 may be in direct contact with each other. In other embodiments, additional layer may be disposed between the first insulating layer 202 and the metal layer 204 and/or between the metal layer 204 and the second insulating layer 206.

In some embodiments, the material and formation method of the first insulating layer 202 and/or the second insulating layer 206 may be the same as or different from the material and formation method of the passivation layer 102. In some embodiments, the material and formation method of the metal layer 204 may be the same as or different from the material or formation method of the contact 104. In some embodiments, the metal layer 204 may be, or include, gold (Au), nickel (Ni), platinum (Pt), palladium (Pd), iridium (Ir), titanium (Ti), chromium (Cr), tungsten (W), aluminum (Al), copper (Cu), molybdenum (Mo), titanium (Ti), silver (Ag), magnesium (Mg), other suitable metal materials, or a combination thereof, but the present disclosure is not limited thereto.

In some embodiments, the metal layer 204 may include or be a highly reflective metal layer. In some embodiments, reflectivity may be a ratio of the power of reflected light to the power of incident light power (the power of reflected light/the power of incident light). In some embodiments, the reflectivity may be a light reflectivity corresponding to the light emitted by the light-emitting unit 300. For example, when the light emitted by the light-emitting unit 300 is visible light, the reflectivity may be the reflectivity at a wavelength of 550 nm of visible light, but the present disclosure is not limited thereto. In some embodiments, the reflectivity of the highly reflective metal layer at a wavelength of 550 nm of visible light is greater than or equal to 85%. For example, the reflectivity of the highly reflective metal layer at the wavelength of 550 nm of visible light is greater than 85%, 87.5%, 90%, 92.5%, 95%, 97.5%, 98%, 99%, or any value or range of values between the foregoing values, but the present disclosure is not limited thereto. Therefore, the metal layer 204 may be provided to increase the reflection and/or scattering of the light emitted by the light-emitting unit 300, reduce the leakage of the light emitted by the light-emitting unit 300 to the outside of the electronic device 1, reduce the light loss of the light-emitting unit 300, make the visual effect of electrons device 1 more uniform, improve the brightness of the electronic device 1 and/or reduce the overall thickness of the electronic device 1.

As shown in FIG. 1, in some embodiments, the solder 106 and the solder 108 may be disposed on the driving substrate SB. In some embodiments, the solder 106 and the solder 108 may be disposed between adjacent reflective structures 200. In some embodiments, the solder 106 is disposed on the contact 104 of the driving substrate SB, and the solder 108 is disposed on the solder 106. In some embodiments, the solder 106 and/or the solder 108 may be, or include, nickel (Ni), tin (Sn), lead (Pb), silver (Ag), copper (Cu), indium (In), bismuth (Bi), zinc (Zn), antimony (Sb), other suitable solders, or a combination thereof, but the present disclosure is not limited thereto. In some embodiments, the solder 106 and the solder 108 may be the same or different. In some embodiments, the solder 106 may include nickel and the solder 108 may include tin, depending on application requirements. In some embodiments, the solder 106 and the solder 108 may provide an electrical connection between the contact 104 of the driving substrate SB and the light-emitting unit 300. For example, the driving substrate SB and the light-emitting unit 300 are bonded in pairs by the solder 106 and/or the solder 108. In some embodiments, one of the solder 106 and the solder 108 may be omitted. In other embodiments, the solder 106 and/or the solder 108 may be a conductive adhesive.

As shown in FIG. 1, in some embodiments, the light-emitting unit 300 may include a light-emitting element, a driving element, a functional layer, a conductive element, another suitable element, or a combination thereof. The light-emitting element may be a pixel, a light-emitting diode, or a photodiode. The conductive element may be a metal layer, a wire, a via, or a bonding pad. The driving element may be a transistor. The functional layer may be an insulating layer, an interlayer dielectric layer, a passivation layer, a planarization layer, or a dielectric material. The present disclosure is not limited thereto.

In some embodiments, the light-emitting unit 300 may be, or include, a diode unit. For example, the light-emitting unit 300 may be a mini LED unit or micro LED unit. In some embodiments, the light-emitting unit 300 may include a conductive pad 302 at the bottom of the light-emitting unit 300. In some embodiments, the material of the conductive pad 302 may be the same or different from the material of the contact 104. In some embodiments, the conductive pad 302 of the light-emitting unit 300 is electrically connected to the solder 108. In some embodiments, the conductive pad 302 substantially covers the top surface of the solder 108. In some embodiments, in the first direction D1, the width of the conductive pad 302 is substantially the same as the width of the solder 108.

In some embodiments, the light-emitting unit 300 has a height h in the second direction D2. In some embodiments, the height h may be less than or equal to 600 um. In some embodiments, the height h may be less than or equal to 600 um, 550 um, 500 um, 450 um, 400 um, 350 um, 300 um, 250 um, 200 um, 190 um, 180 um, 170 um, 160 um, 150 um, 140 um, 130 um, 120 um, 110 um, 100 um, other suitable values, or any value or range of values between the foregoing values.

It should be noted that the height of the optical reflective adhesive such as white glue may be at least greater than or equal to 180 um and less than or equal to 200 um (180 um≤the height≤200 um), so that the optical reflective adhesive may have sufficient reflectivity. Therefore, when the height of the light-emitting unit 300 is less than or close to the required height of the optical reflective adhesive, the optical reflective adhesive will cover or overflow onto the light-emitting unit 300, so using the optical reflective adhesive as the reflective component will greatly reduce the light-emitting performance of the electronic device. In addition, it is difficult to cut the optical reflective sheet into a size suitable for the light-emitting unit 300 of the above-mentioned size. In the case where the size of the optical reflective sheet does not match the size of the light-emitting unit 300, using the optical reflective sheet as the reflection component will greatly reduce the light-emitting performance of electronic device. However, since the reflective structure 200 of the present disclosure includes the highly reflective metal layer 204, it is not limited to the above problems, and may improve the light-emitting performance of the electronic device 1.

As shown in FIG. 1, in some embodiments, in the first direction D1, at least one of the first insulating layer 202 and the second insulating layer 206 of the reflective structure 200 is disposed between the metal layer 204 and the contact 104, so as to provide electrical isolation between the metal layer 204 and the contact 104, thereby reducing the problems of leakage current, short circuits, and/or electrical interference that may occur between the metal layer 204 and the contact 104.

As shown in FIG. 1, in some embodiments, a portion 200a of the reflective structure 200 may be located below the light-emitting unit 300 in the second direction D2. Therefore, the portion 200a of the reflective structure 200 may improve the reflection and/or scattering of light below the light-emitting unit 300, reduce light leakage, reduce light loss, improve the overall visual effect, and/or increase brightness. In some embodiments, at least one of the first insulating layer 202 and the second insulating layer 206 in the portion 200a of the reflective structure 200 may be disposed between the metal layer 204 and the contact 104 and/or disposed between the metal layer 204 and the solder 106. Therefore, the first insulating layer 202 and/or the second insulating layer 206 may provide electrical isolation between the metal layer 204 and the contact 104 and/or between the metal layer 204 and the solder 106. Therefore, problems of leakage current, short circuit, and/or electrical interference between the metal layer 204 and the contact 104 and/or between the metal layer 204 and the solder 106 may be reduced. In some other embodiments, the metal layer 204 and/or the second insulating layer 206 in the portion 200a of the reflective structure 200 may be omitted, so as to avoid electrical problems between the metal layer 204 and the solder 106 and/or simplify the process for forming the second insulating layer 206.

As shown in FIG. 1, in some embodiments, the first region R1 of the electronic device 1 is marked with a dashed block. In some embodiments, in the first region R1, the first insulating layer 202 is disposed on the conductive layer 104', the metal layer 204 is disposed on the first insulating layer 202, and the second insulating layer 206 is disposed on the metal layer 204. In some embodiments, in the first region R1, the reflective structure 200 is conformally disposed on the conductive layer 104'. In some embodiments, the materials and formation methods of the contact 104 and the conductive layer 104' may be the same or different. In some embodiments, the contact 104 and the conductive layer 104' may be formed in the same process, or formed in different processes.

Figure 2:
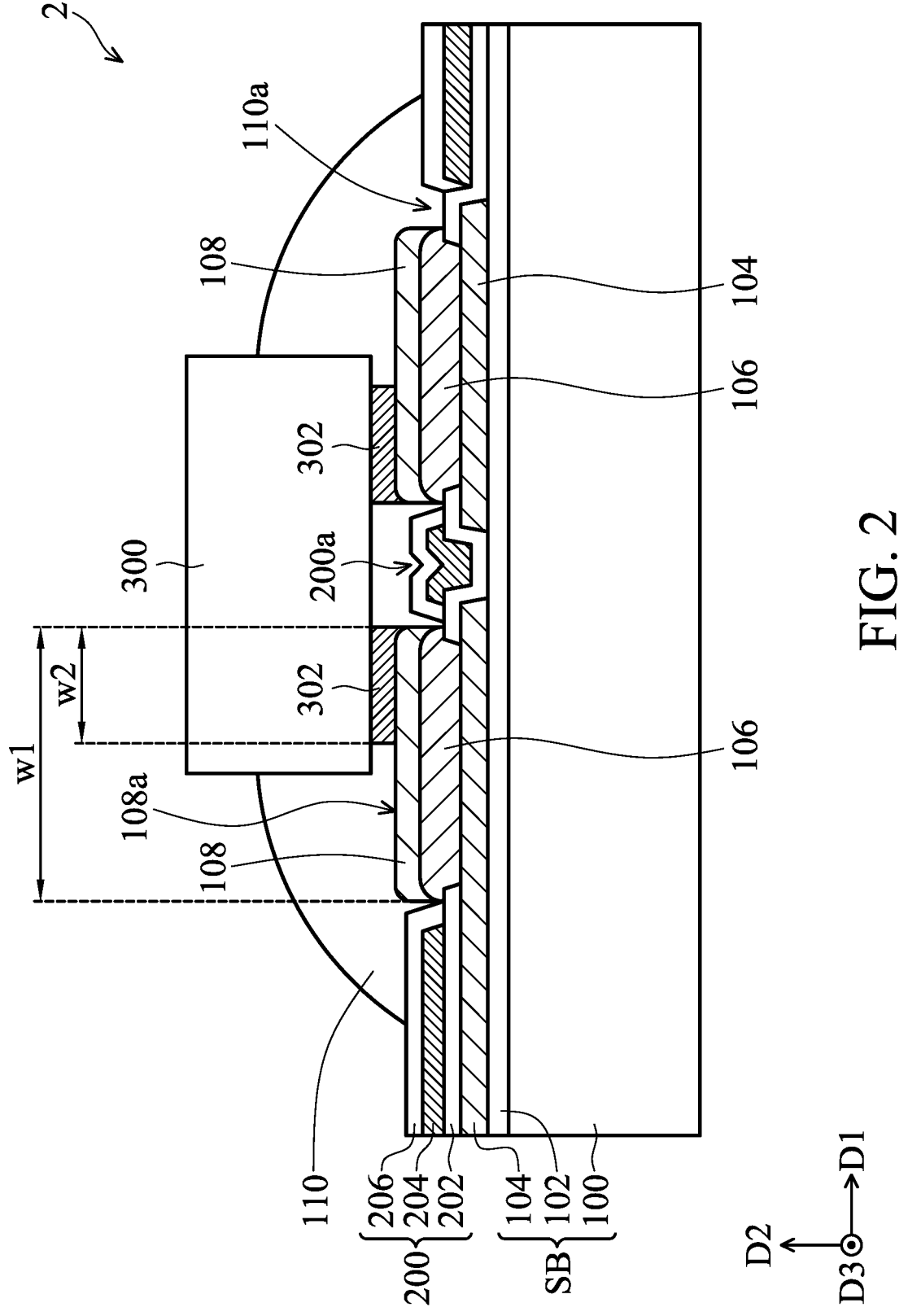
FIG. 2 is a schematic cross-sectional view showing an electronic device according to some embodiments of the present disclosure.

Referring to FIG. 2, it is a schematic cross-sectional view showing an electronic device 2 according to some embodiments of the present disclosure. Hereinafter, the same or similar descriptions will not be repeated. As shown in FIG. 2, in some embodiments, the conductive pad 302 of the light-emitting unit 300 may cover a portion of the solder 108 and may expose another portion of the solder 108. In some embodiments, the conductive pad 302 is not disposed on the exposed portion 108a of the solder 108 in the second direction D2. In some embodiments, in the second direction D2, the projection of the conductive pad 302 and/or the light-emitting unit 300 to the substrate 100 may located within the projection of the solder 108 to the substrate 100. In some embodiments, the exposed portion 108a of the solder 108 may be located between the light-emitting unit 300 and the reflective structure 200, and the exposed portion 108a of the solder 108 does not overlap the light-emitting unit 300 in the second direction D2. In some embodiments, in the first direction D1, the solder 108 has a first width w1, the conductive pad 302 has a second width w2, and the first width w1 may be greater than the second width w2. Therefore, the process margin and reliability of the paired bonding process of the conductive pad 302 of the light-emitting unit 300 between the solder 108 on the driving substrate SB may be improved.

As shown in FIG. 2, in some embodiments, the electronic device 2 may further include a reflective layer 110. In some embodiments, the reflective layer 110 may be disposed on the exposed portion 108a of the solder 108, the second insulating layer 206 of the reflective structure 200, and the side surface of the light-emitting unit 300. In some embodiments, the reflective layer 110 may cover the exposed portion 108a of the solder 108 in the second direction D2. Therefore, the reflective layer 110 may improve the reflectivity of the exposed portion 108a of the solder 108. In some embodiments, the reflective layer 110 may be formed by a dispensing process, other suitable processes, or a combination of the aforementioned processes, but the present disclosure is not limited thereto.

In some embodiments, the reflective layer 110 may be disposed on the side surface of the conductive pad 302. In some embodiments, the reflective layer 110 may be disposed on the side surface of the light-emitting unit 300, and the reflective layer 110 may expose the light-emitting surface (for example, the top surface) of the light-emitting unit 300. In some embodiments, the reflective layer 110 may have a curved profile or a drop-shaped profile when viewed in a cross-sectional view. In some embodiments, the reflective layer 110 may be disposed on the side surface and the top surface of the reflective structure 200 when viewed in a cross-sectional view. In other embodiments, the reflective layer 110 may be disposed on the side surface of the reflective structure 200 and expose the top surface of the reflective structure 200 when viewed in a cross-sectional view. In some other embodiments, the reflective layer 110 may expose the side surface and the top surface of the reflective structure 200 when viewed in a cross-sectional view, and the reflective layer 110 may be separated from the reflective structure 200 by a distance in the first direction D1.

In some embodiments, at least a portion 110a of the reflective layer 110 may be located between the solder 106, the solder 108, and the reflective structure 200, in order to reduce the problems of leakage current, short circuit, and/or electrical interference between the solder 106, the solder 108, and the metal layer 204 in the reflective structure 200.

In some embodiments, the material of the reflective layer 110 may include or be an adhesive material. In some embodiments, the adhesive material may include or be white paint, white glue, adhesive material with high reflectivity, other suitable adhesive materials, or a combination thereof, but the present disclosure is not limited thereto. Therefore, in the case that the reflective layer 110 may include an adhesive material, the reflective layer 110 may provide protection for the light-emitting unit 300 and the reflective structure 200.

In some embodiments, the reflective layer 110 may include or be a highly reflective adhesive. In some embodiments, the reflectivity of the reflective layer 110 at a wavelength of 550 nm of visible light is greater than or equal to 80%. For example, the reflectivity of the reflective layer 110 at a wavelength of 550 nm of visible light is greater than 80%, 82.5%, 85%, 87.5%, 90%, 92.5%, 95%, 97.5%, 98%, 99%, or any value or range of values between the foregoing values, but the present disclosure is not limited thereto.

Therefore, the reflective layer 110 may improve the reflectivity of the electronic device 2.

Figure 3:
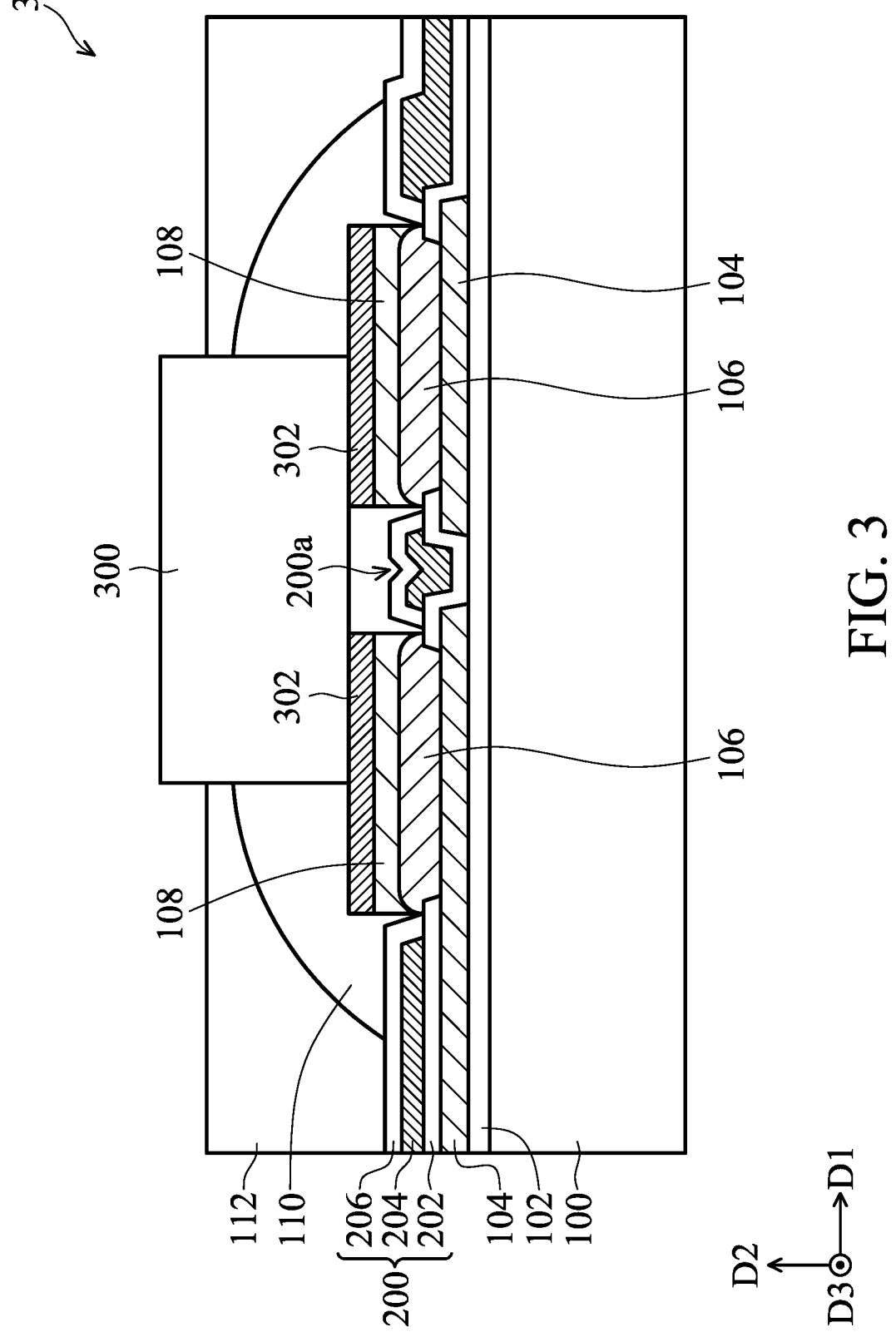
FIG. 3 is a schematic cross-sectional view showing an electronic device according to some embodiments of the present disclosure.

FIG. 3 is a schematic cross-sectional view showing an electronic device 3 according to some embodiments of the present disclosure. Hereinafter, the same or similar descriptions will not be repeated. As shown in FIG. 3, in some embodiments, the electronic device 3 may further include a protective layer 112. In some embodiments, the protective layer 112 may be disposed on the reflective structure 200. As shown in FIG. 3, in some embodiments, the protective layer 112 may be disposed on the reflective layer 110, the side surface and the top surface of the second insulating layer 206 of the reflective structure 200, and the side surface of the light-emitting unit 300. In some embodiments, the protective layer 112 may prevent the top surface of the second insulating layer 206 from having a defect such as a pinhole. Thus, the problems that the metal layer 204 located under the second insulating layer 206 is oxidized and/or the leakage currents is generated between the metal layer 204 and other components may be reduced. In addition, since the protective layer 112 may provide insulating properties, the thickness of the second insulating layer 206 and/or the reflective layer 110 (in the second direction D2) may be reduced, thereby reducing the overall thickness of the electronic device 3 (in the second direction D2).

In other embodiments, the reflective layer 110 in the electronic device 3 may be omitted, so the protective layer 112 may be disposed on the second insulating layer 206 of the reflective structure 200. For example, the protective layer 112 may contact the second insulating layer 206 of the reflective structure 200, the side surface of the solder 106, the side surface and the top surface of the solder 108, and the side surface of the light-emitting unit 300.

In some embodiments, the material of the protective layer 112 may include or be an adhesive material. In some embodiments, the adhesive material may be, or include, optically clear adhesive (OCA), optically clear resin (OCR), other suitable adhesive materials, or any combination of the foregoing, but the present disclosure is not limited thereto. In some embodiments, the adhesive material may include or be an acrylic acid-based adhesive. In some embodiments, the material of the protective layer 112 may be, or include, a molding material, so the protective layer 112 may be used to fix the light-emitting unit 300.

Figure 4:
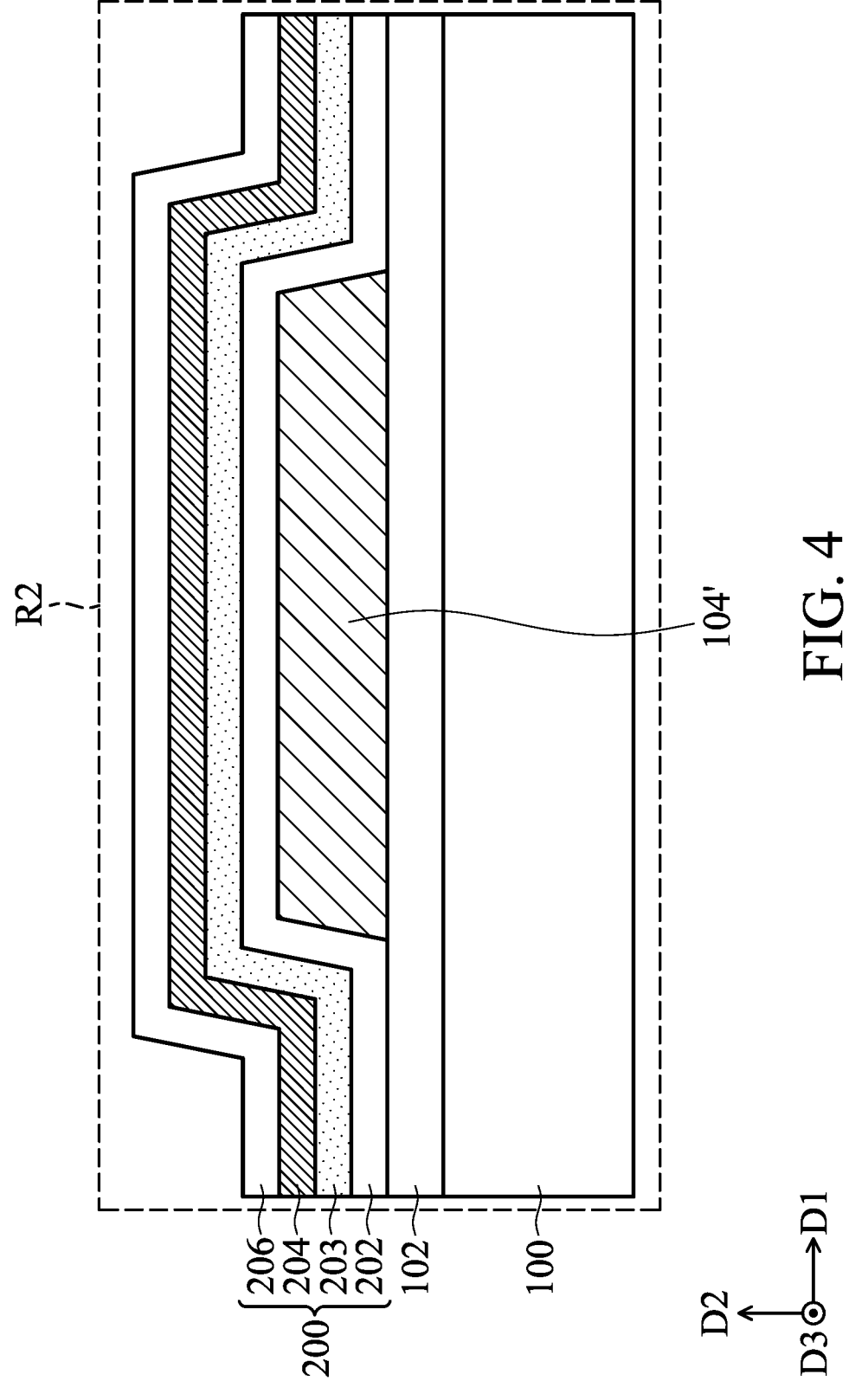
FIG. 4 is a schematic cross-sectional view showing a region of an electronic device according to some embodiments of the present disclosure.

FIG. 4 is a schematic cross-sectional view showing the second region R2 of the electronic device according to some embodiments of the present disclosure. Wherein, the second region R2 shown in FIG. 4 is another embodiment of the first region R1 shown in FIG. 1, so the second region R2 shown in FIG. 4 may be applied to electronic devices 1 to 3 shown FIG. 1 to FIG. 3.

As shown in FIG. 4, in some embodiments, the reflective structure 200 may further include a reflective film 203. In some embodiments, the reflective film 203 may be disposed between the first insulating layer 202 and the metal layer 204 and/or between the metal layer 204 and the second insulating layer 206. In the second region R2, the first insulating layer 202 is disposed on the conductive layer 104', the reflective film 203 is disposed on the first insulating layer 202, the metal layer 204 is disposed on the reflective film 203, and the second insulating layer 206 is disposed on the metal layer 204.

In some embodiments, the material of the reflective film 203 may be, or include, white photoresist or white glue. Therefore, in a case where the reflective film 203 includes white photoresist, it is easier to form the reflective film 203 on the first insulating layer 202, thereby improving the reliability of the electronic device. In some embodiments, the reflective film 203 may include or be an insulating material. Therefore, the reflective film 203 may provide insulation performance between the contact 104 and the metal layer 204, so as to avoid leakage current, short circuit, and/or electrical interference between the contact 104 and the metal layer 204. In addition, since the reflective film 203 may be disposed on the first insulating layer 202, the reflective film 203 may prevent the top surface of the first insulating layer 202 from having a defect such as a pinhole. Thus, the problems that the contact 104 located under the first insulating layer 202 is oxidized and/or the leakage currents is generated between the metal layer 204 and contact 104 may be reduced.

In some embodiments, the reflectivity of the reflective film 203 at a wavelength of 550 nm of visible light is greater than or equal to 80%. For example, the reflectivity of the reflective film 203 at a wavelength of 550 nm of visible light is greater than 80%, 82.5%, 85%, 87.5%, 90%, 92.5%, 95%, 97.5%, 98%, 99%, or any value or range of values between the foregoing values, but the present disclosure is not limited thereto. Therefore, since the reflective structure 200 includes the reflective film 203 and the metal layer 204, the reflectivity of the electronic device may be improved by the reflective film 203 and the metal layer 204 together.

Figure 5:
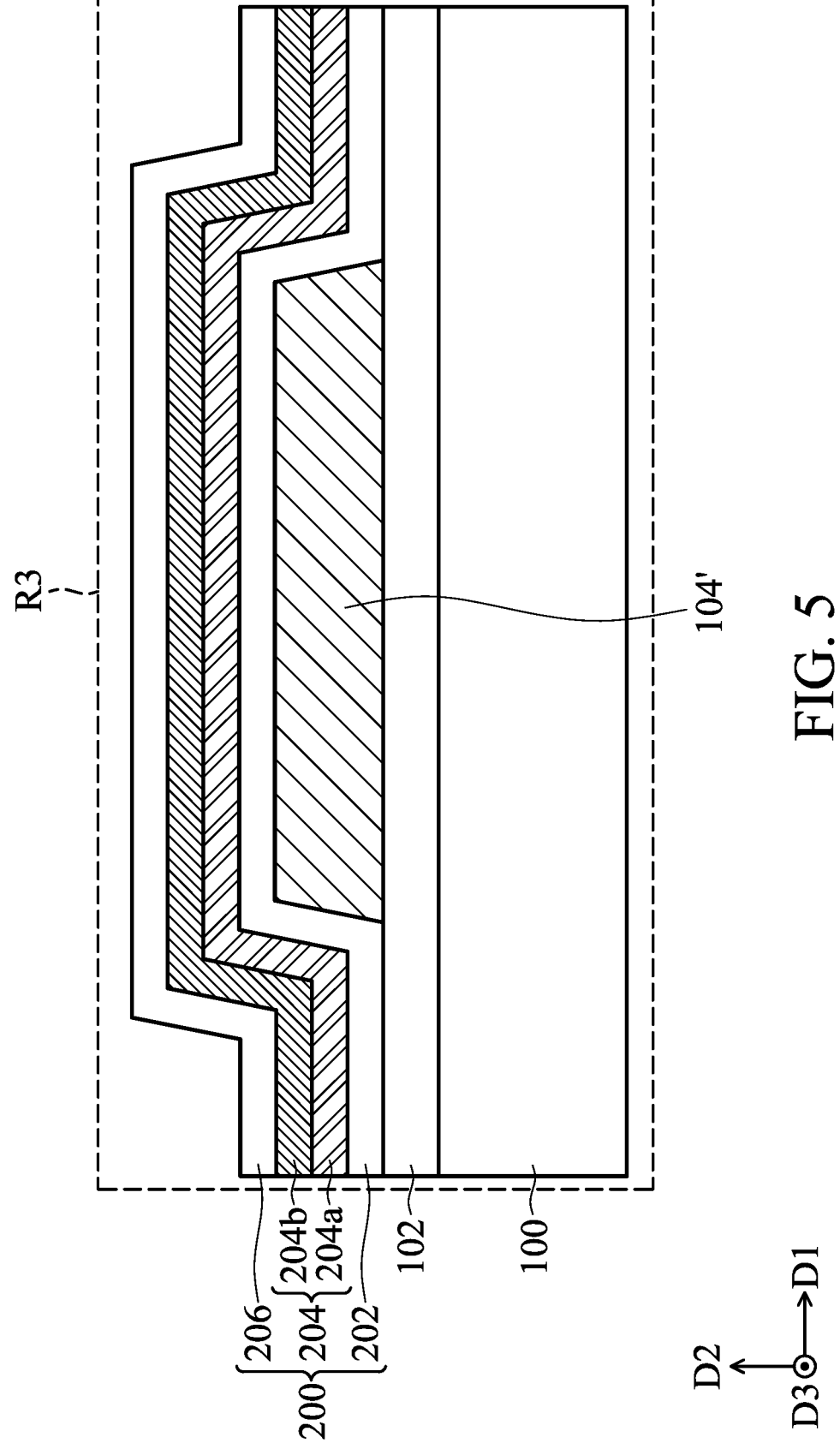
FIG. 5 is a schematic cross-sectional view showing a region of an electronic device according to some embodiments of the present disclosure.

FIG. 5 is a schematic cross-sectional view showing a region of an electronic device according to some embodiments of the present disclosure. Wherein, the third region R3 shown in FIG. 5 is another embodiment of the first region R1 shown in FIG. 1 and/or the second region R2 shown in FIG. 4, so the third region R3 shown in FIG. 5 may be applied to the electronic devices 1 to 3 shown in FIG. 1 to FIG. 3.

As shown in FIG. 5, in some embodiments, the metal layer 204 may further include a first metal layer 204a and a second metal layer 204b. In the third region R3, the first insulating layer 202 is disposed on the conductive layer 104', the first metal layer 204a is disposed on the first insulating layer 202, the second metal layer 204b is disposed on the first metal layer 204a, and the second insulating layer 206 is disposed on the second metal layer 204b. In some embodiments, the material and formation method of the first metal layer 204a and/or the second metal layer 204b may be the same as or different from the material and formation method of the metal layer 204. In some embodiments, the first metal layer 204a and/or the second metal layer 204b may be, or include, gold (Au), nickel (Ni), platinum (Pt), palladium (Pd), iridium (Ir), titanium (Ti), chromium (Cr), tungsten (W), aluminum (Al), copper (Cu), molybdenum (Mo), titanium (Ti), silver (Ag), magnesium (Mg), other suitable metal materials, or any combination of the foregoing, but the present disclosure is not limited thereto. In some embodiments, the materials of the first metal layer 204a and the second metal layer 204b are different, so there is substantially an interface between the first metal layer 204a and the second metal layer 204b.

In some embodiments, the reflectivity of the first metal layer 204a and/or the second metal layer 204b at a wavelength of 550 nm of visible light may be greater than or equal to 85%. For example, the reflectivity of the first metal layer 204a and/or the second metal layer 204b at a wavelength of 550 nm of visible light is greater than 85%, 87.5%, 90%, 92.5%, 95%, 97.5%, 98%, 99%, or any value or range of values between the foregoing values, but the present disclosure is not limited thereto. In some embodiments, the reflectivity of the first metal layer 204a is different from the reflectivity of the second metal layer 204b.

In some embodiments, in the second direction D2, the thickness of the first metal layer 204*a* may be smaller than the thickness of the second metal layer 204*b*. Therefore, the first metal layer 204*a* may be used as a seed layer and/or a buffer layer to improve the reliability of the second metal layer 204*b*. In some embodiments, in the second direction D2, the thickness of the first metal layer 204*a* and/or the second metal layer 204*b* may be greater than or equal to 0.4 um and less than or equal to 1 um (0.4 um≤the thickness of the first metal layer 204*a* and/or second metal layer 204*b*≤1 um). In some embodiments, if the thickness of the first metal layer 204*a* is smaller than that of the second metal layer 204*b*, the reflectivity of the first metal layer 204*a* may be smaller than the reflectivity of the second metal layer 204*b*.

In summary, according to the embodiments of the present disclosure, an electronic device including a reflective structure is provided. The problem of the difficulty of disposing an optical reflective sheet or an optical reflective adhesive for a small-sized light-emitting unit after a miniaturization process may be solved by the laminated reflective structure. Therefore, the reflective structure of the present disclosure may improve the reliability, electrical performance, and/or optical performance of the electronic device.

Specifically, when the optical reflective sheet is used as the reflective component, the reflectivity will be increased by enlarging the opening corresponding to the light-emitting unit in the optical reflective sheet. However, this reduces the reflectivity around the light-emitting unit. In addition, when the optical reflective adhesive is used as the reflective component, the thickness of the optical reflective adhesive may be thinned to reduce the problem of overflowing or covering the light-emitting surface of the light-emitting unit. However, this reduces the reflectivity of the optical reflective adhesive itself, making the optical reflective adhesive difficult to provide sufficient reflectivity. However, the reflective structure of the present disclosure may provide high reflectivity performance by the highly reflective metal layer without reducing the reflectivity around the light-emitting unit and/or without reducing the overall reflectivity. Therefore, the reflective structure disclosed in the present disclosure may be widely applied to light-emitting units of various sizes.

The features among the various embodiments may be arbitrarily combined as long as they do not violate or conflict with the spirit of the disclosure. In addition, the scope of the present disclosure is not limited to the process, machine, manufacturing, material composition, device, method, and step in the specific embodiments described in the specification. A person of ordinary skill in the art will understand current and future processes, machine, manufacturing, material composition, device, method, and step from the content disclosed in some embodiments of the present disclosure, as long as the current or future processes, machine, manufacturing, material composition, device, method, and step performs substantially the same functions or obtain substantially the same results as the present disclosure. Therefore, the scope of the present disclosure includes the above-mentioned process, machine, manufacturing, material composition, device, method, and steps. It is not necessary for any embodiment or claim of the present disclosure to achieve all of the objects, advantages, and/or features disclosed herein.

The foregoing outlines features of several embodiments of the present disclosure, so that a person of ordinary skill in the art may better understand the aspects of the present disclosure. A person of ordinary skill in the art should appreciate that, the present disclosure may be readily used as a basis for designing or modifying other processes and structures for carrying out the same purposes and/or achieving the same advantages of the embodiments introduced herein. A person of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. An electronic device, comprises:
a driving substrate comprising a contact;
a light-emitting unit disposed on the driving substrate and electrically connected to the contact; and
a reflective structure disposed on the driving substrate;
wherein the reflective structure comprises a first insulating layer, a metal layer, and a second insulating layer, and the metal layer is disposed between the first insulating layer and the second insulating layer,
wherein the metal layer comprises a first metal layer and a second metal layer, the second metal layer is disposed on the first metal layer, and a material of the first metal layer is different from a material of the second metal layer.

2. The electronic device as claimed in claim 1, wherein at least one of the first insulating layer and the second insulating layer is disposed between the metal layer and the contact.

3. The electronic device as claimed in claim 1, wherein a material of the metal layer comprises silver or aluminum.

4. The electronic device as claimed in claim 1, wherein the metal layer comprises a highly reflective metal layer, and reflectivity of the highly reflective metal layer at a wavelength of 550 nm of visible light is greater than or equal to 85%.

5. The electronic device as claimed in claim 1, wherein the light-emitting unit has a height less than or equal to 600 um.

6. The electronic device as claimed in claim 1, wherein the thickness of the first metal layer is smaller than the thickness of the second metal layer.

7. The electronic device as claimed in claim 1, further comprising:
a protection layer disposed on the reflective structure.

8. The electronic device as claimed in claim 7, wherein the protection layer is disposed on a top surface of the second insulating layer.

9. The electronic device as claimed in claim 7, wherein a material of the protective layer comprises an adhesive material.

10. The electronic device as claimed in claim 1, further comprising:
a solder, wherein the light-emitting unit is electrically connected with the contact by the solder, and the solder comprises an exposed portion, and the exposed portion is disposed between the light-emitting unit and the reflective structure; and
a reflective layer disposed on the exposed portion of the solder.

11. The electronic device as claimed in claim 10, wherein a material of the reflective layer comprises an adhesive material.

12. The electronic device as claimed in claim 10, wherein reflectivity of the reflective layer at visible light is greater than or equal to 80%.

13. The electronic device as claimed in claim 10, wherein at least a portion of the reflective layer is located between the solder and the reflective structure.

14. The electronic device as claimed in claim 1, wherein a portion of the reflective structure is disposed under the light-emitting unit.

15. The electronic device as claimed in claim 14, wherein at least one of the first insulating layer and the second insulating layer in the portion of the reflective structure is disposed between the metal layer and the contact or between the metal layer and a solder.

16. The electronic device as claimed in claim 14, wherein the metal layer or the second insulating layer in the portion of the reflective structure is omitted.

17. The electronic device as claimed in claim 1, wherein the reflective structure further comprises a reflective film disposed between the first insulating layer and the metal layer or between the second insulating layer and the metal layer.

18. The electronic device as claimed in claim 17, wherein a material of the reflective film comprises a white photoresist or a white glue.

19. The electronic device as claimed in claim 17, wherein reflectivity of the reflective film at a wavelength of 550 nm of visible light is greater than or equal to 80%.

* * * * *